(12) United States Patent
Mann et al.

(10) Patent No.: US 7,053,458 B2
(45) Date of Patent: May 30, 2006

(54) SUPPRESSING RADIATION CHARGES FROM REACHING DARK SIGNAL SENSOR

(75) Inventors: Richard A. Mann, Torrance, CA (US); Selim Bencuya, Irvine, CA (US)

(73) Assignee: ESS Technology, Inc., Freemont, CA (US)

( * ) Notice: Subject to any disclaimer, the term of this patent is extended or adjusted under 35 U.S.C. 154(b) by 281 days.

(21) Appl. No.: 10/136,413

(22) Filed: Apr. 30, 2002

(65) Prior Publication Data

US 2003/0201518 A1   Oct. 30, 2003

(51) Int. Cl.
    *H01L 27/14* (2006.01)
(52) U.S. Cl. .................... 257/452; 257/414; 257/428; 257/431; 257/449
(58) Field of Classification Search .............. 250/208; 257/224, 225, 226, 227, 228, 229, 230, 231, 257/232, 233, 234, 222, 223, 431, 433, 432; 438/257, 264
    See application file for complete search history.

(56) References Cited

U.S. PATENT DOCUMENTS 5,214,272 A * 5/1993 Ueno
5,614,744 A * 3/1997 Merrill
6,211,013 B1 * 4/2001 Park et al.
6,583,486 B1 * 6/2003 Kim
2001/0005224 A1 * 6/2001 Lee
2001/0043274 A1 * 11/2001 Shepherd et al.
2002/0140997 A1 * 10/2002 McDermott et al.

* cited by examiner

*Primary Examiner*—Nathan J. Flynn
*Assistant Examiner*—Kevin Quinto
(74) *Attorney, Agent, or Firm*—Farjami & Farjami LLP

(57) ABSTRACT

An image sensor and method is provided to improve the measurement of a dark signal reference while substantially suppressing radiation charges that enter an active area of the image sensor from reaching a shielded dark signal detector. In one implementation, dark signal detector is shielded and separated from the active area to substantially reduce the radiation charges that reach the dark signal detector. In another implementation, the image sensor includes a radiation guard that is disposed between the active area and the shielded detector. When radiation or light is permitted to enter the active area, the guard when adequately biased attracts and collects radiated charges that may otherwise travel beyond the active area to reach the shielded detector and contaminate a measurement for the dark signal reference.

12 Claims, 5 Drawing Sheets

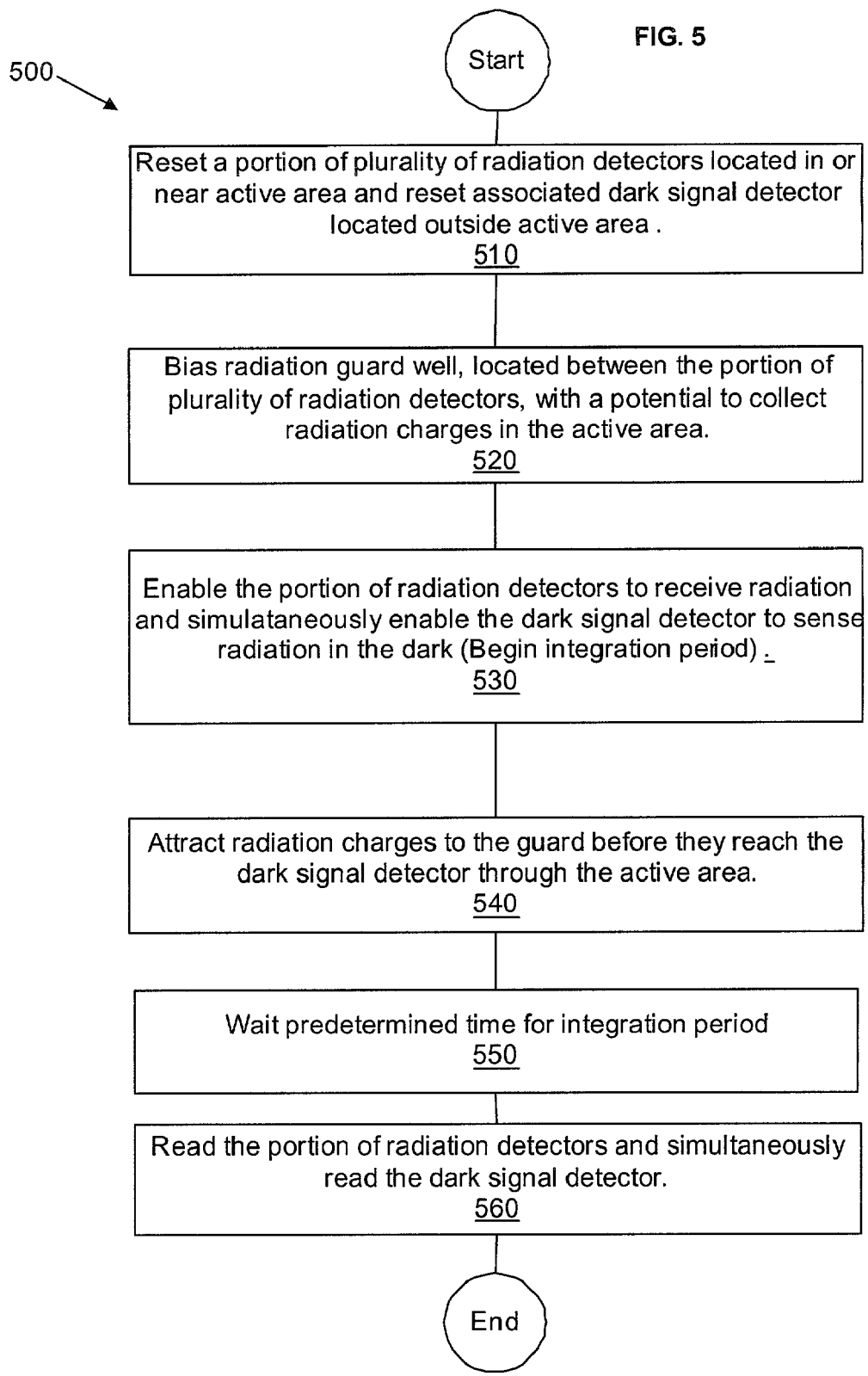

SUPPRESSING RADIATION CHARGES FROM REACHING DARK SIGNAL SENSOR

BACKGROUND OF THE INVENTION

1. Technical Field

This invention relates generally to electronic imaging devices, and in particular, to measuring dark signals in electronic imaging devices.

2. Related Art

Conventional solid-state image sensor, such as a CMOS image sensor, typically has an array of pixels arranged in an active area. Each pixel in the active area has a radiation detector, such as a photodiode, to sense radiation intensity. During an integration period the radiation intensity is sampled and a charge is read out of the radiation detector as an electrical signal by an associated image processor. CMOS image sensors typically have a dark signal level or voltage offset that occurs primarily from low levels of junction leakage. The exact extent of junction leakage can vary with slight changes in manufacturing conditions causing differences in the expected output signal under conditions of zero illumination (darkness). Changes in operating condition such as integration time or temperature may also cause the value of the dark signal level to vary in the CMOS image sensor.

Knowledge of the dark signal level, sometimes referred to as "black reference level", is useful in the reconstruction of images captured by the CMOS image sensors. Conventional image sensors often measure current leakage or the dark signal level during an integration period in order to provide a black reference level. Selected pixels in the solid-state image sensor are covered with an opaque material during fabrication to prevent radiation (i.e. light) from directly striking the photo detector. The application of a simple light shield approach during fabrication suffices to establish a dark reference level during an integration period under some conditions.

A problem exists with utilizing the simple light shield approach when a bright source of radiation, such as a light bulb, sun or long wavelength radiation, such as red light having a wavelength of 600 to 680 nanometers, illuminates the edge of the active area in the solid-state imager sensor. Radiation from bright sources near the edge of the active area is able to penetrate laterally and relatively deep into the semiconductor substrate of the solid-state image sensor creating charge carriers (i.e. electron-hole pairs). While the electron holes may diffuse to a substrate isolation terminal (i.e. ground), the minority carriers (electrons) often diffuse to neighboring covered or otherwise shielded pixels. The diffusion of the minority carriers results in an increase in the measured dark reference level. This increase in dark reference level (also referred to as cross-talk) results in a false or inaccurate black reference level, which in turn, adversely affects the detected image quality.

A conventional approach to reducing the cross-talk problem in a solid-state image sensor requires dummy pixels between active area pixels and shielded pixels. The dummy pixels act to isolate the shielded pixels that measure the dark reference level from the diffusion of the minority carriers. A single column of dummy or isolation pixels, however, is generally insufficient to prevent cross-talk from occurring. Multiple columns and rows of isolation pixels are needed to correct for gaps or insufficient depth of the photo-detector in each isolation pixel and may require a relatively significant amount of area in the solid-state imager resulting in larger die sizes. Furthermore, the type and amount of light shield material utilized to cover the dark signal detectors (i.e. colored photoresist material) also increase the cost and complexity of fabrication. Thus, there is a need in the art for measurement of the dark signal reference without significantly increasing the cost, die size and complexity of a solid-state image sensor.

SUMMARY

A number of technical advances are achieved in the art by implementing an approach for suppressing radiation charges from reaching a dark signal sensor. Broadly conceptualized, suppressing radiation charges from reaching the dark signal sensor allows a dark signal to be measured simultaneously with the integration and read out of a radiation detector, to produce and improve black reference level for post processing of an image.

An example implementation of the radiation sensor utilizes a shielded dark signal detector that is sufficiently separated from the radiation detector to substantially suppress radiation charges from reaching the dark signal detector through the active area of the radiation sensor. In addition, the radiation sensor includes a radiation guard ring that is reversed biased in the same manner as the radiation detector and the dark signal detector so as to interdict radiation charges in the active area from reaching the dark signal detector.

During the integration period when the radiation detectors in the active area are permitted to sense radiation, the ring is preferably reversed biased with respect to the substrate. During that time a depletion region between the guard ring and substrate develops. The depletion region sufficiently suppresses the free electrons from reaching the shielded detectors that enter and then travel laterally through the active area.

Other systems, methods features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. In the figures, like reference numerals designate corresponding parts throughout the different views.

FIG. 5 is a flow diagram illustrating an example process for measuring a dark signal while suppressing radiation charges from reaching a dark signal detector.

DETAILED DESCRIPTION OF THE PREFERRED EMBODIMENTS

Figure 1:
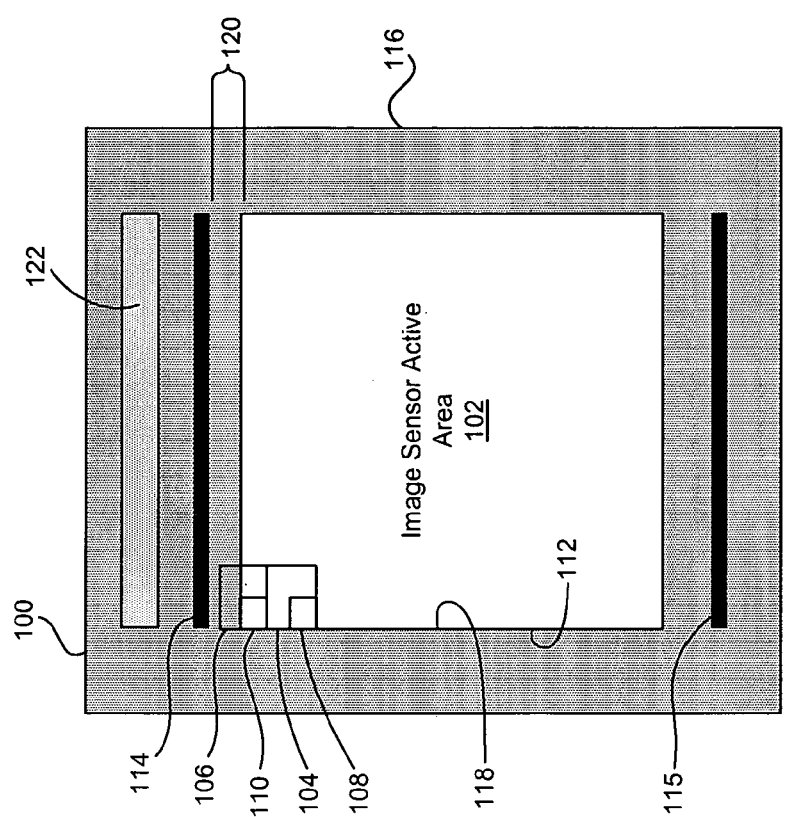
FIG. 1 is a top-level illustrating a solid-state image sensor having an exemplary shielded dark signal detector in accordance with an embodiment of the invention.

In FIG. 1, a top-level view of an exemplar implementation of a solid-state image or radiation sensor 100 having an exemplary shielded dark signal detector 114 and 115 is illustrated. The solid-state image sensor 100 includes an active area 102 having a plurality of cells (only two cells 104 and 106 of a plurality of cells are show in FIG. 1). Each of the cells 104 and 106 has a respective radiation detector 108 and 110 located on the periphery of the active area defined by an outer edge 112. The radiation detector 108 and 110 receives charges and converts the charges into a corresponding electrical signal for utilization by an image processor.

The image sensor 100 includes dark signal detectors 114 and 115. The dark signal detectors 114 and 115 are disposed beneath a shield 116 to prevent radiation charges from directly reaching the dark signal detectors 114 and 115. The interior edge 118 of the shield 116 extends along an outer edge 112 of the active area 102. The shield 116 preferably surrounds the perimeter of active area 102 and is fabricated from metal (commonly referred to as top-metal) that is also utilized for signal routing in a CMOS embodiment. In other embodiments, the shield 116 is fabricated from an oblique material, such as glass, ceramic, plastic, or epoxy that block radiation charges from reaching the dark signal detectors 114 and 115. In the current implementation, the dark signal detectors 114 and 115 are spaced apart from radiation detector 104 in order to prevent minority carriers that are not absorbed by the radiation detector 104 from reaching the dark signal detectors 114 and 115. Thus, an advantage over the known approaches is achieved by eliminating the operation of dummy columns or rows interposed between the dark signal detectors and the lighted array as power consumption may be reduced.

Each dark signal detector 114 and 115 in a row of dark signal detectors is read simultaneously via column circuit elements 122. The dark signal detectors 114 and 115 are arranged in columns outside of the active area 102. The dark signal detectors 114 and 115 are separately selected and read via an associated column circuit element 122. In an alternate implementation, the column circuit elements 122 are expanded to handle additional column read-out capability, and thus reduce the fill factor of the radiation sensor 100. Column-circuit elements 122 are utilized to read a selected portion or row of radiation detectors 108 and 110 in active area 102. A detailed description of the column circuit elements 122, however, is not necessary to understand the present invention.

Figure 2:
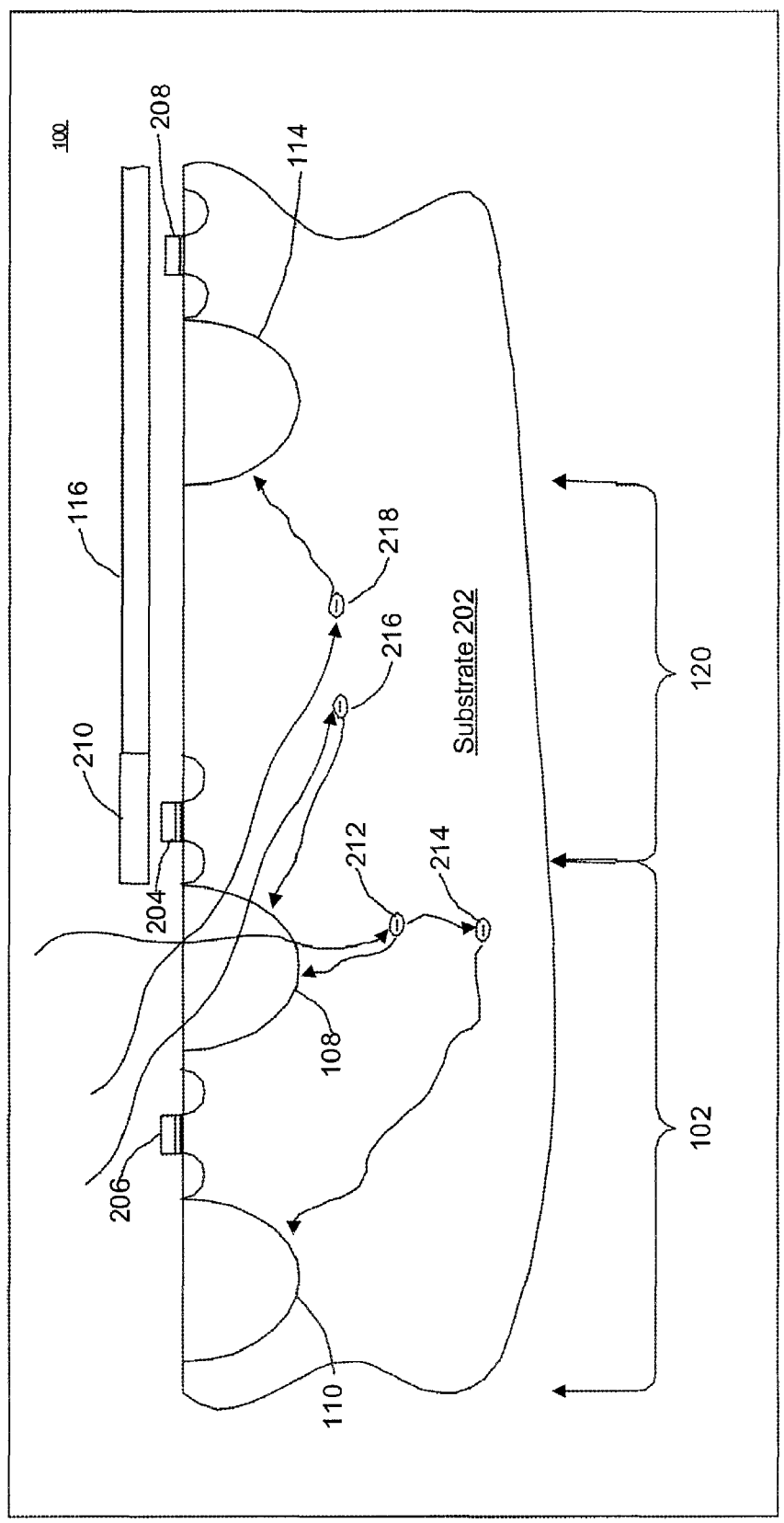
FIG. 2 is a cross sectional view illustrating solid-state image sensor of FIG. 1 with separation between the exemplary shielded dark signal detector and the active area to suppress cross-talk.

In FIG. 2, a cross sectional view of solid-state image sensor 100 of FIG. 1 with separation between the exemplary shielded dark signal detector 114 and the active area 102 are illustrated. The active area 102 with column circuit element 206 and the dark signal detector 114 with column circuit element 208 are formed within substrate 202 of solid-state image sensor 100. The dark signal detector 114 has a sufficient separation 120 from the active area 102 to reduce the interactions (i.e., radiation charges reaching the dark signal detector 114) that occur as compared with little or no separation. The separation between the dark signal detector 114 and the active area 102 is preferably at least 50 angstroms and the dark signal detector 114 is located approximately 200 angstroms from the active area 102 to limit cross-talk interactions to 5–15% of the cross-talk interaction that occur with little or no separation. Where column circuit element 204 (or other circuitry of imaging sensor 100) is located between the shield 116 and the radiation detector 108, the column circuit element 204 acts as an extension 210 of the shield 116. Further, the shield 116 prevents direct radiation from entering the active area 102. In this instance, the outer edge of the active area 102 is where the edge of the radiation detector 108 meets the column circuit element 204 and the column circuit element 204 represents the extension 210 of the shield 116.

Radiation penetrates into the substrate 202 of the solid-state image sensor 100 creating electron hole pairs (only minority carrier shown) even when the radiation detector 108 is biased to absorb and store the radiation charge carriers. The minority carrier 212 received by the image sensor 100 may diffuse back to be collected by the radiation detector 108. Other minority carriers, such as 214, 216 and 218 that are generated deeper in the substrate 202 of the solid-state image sensor 100 are able to diffuse to neighboring detector 110 and dark signal detector 114.

Interactions with the dark signal detector 114 are limited, because of the separation 120 of the dark signal detector 114 from the radiation detector 108. The minority carriers 214 and 216 are prevented from reaching dark signal detector 114 to contaminate the black reference level measurement of the dark signal. The separation of the dark signal detectors from the active area 102 greatly improves the quality of the dark reference level measurement under most imaging conditions. However, if extremely bright light radiation sources are near the edge of the lighted array a significant number of photoelectrons may still diffuse to the reference row. Operation of the image sensor with a precise dark reference under these extreme conditions requires that the distance 120 be increased to about 200 microns. This distance can be reduced substantially by the use of a radiation guard ring as discussed in FIGS. 3 and 4.

Figure 3:
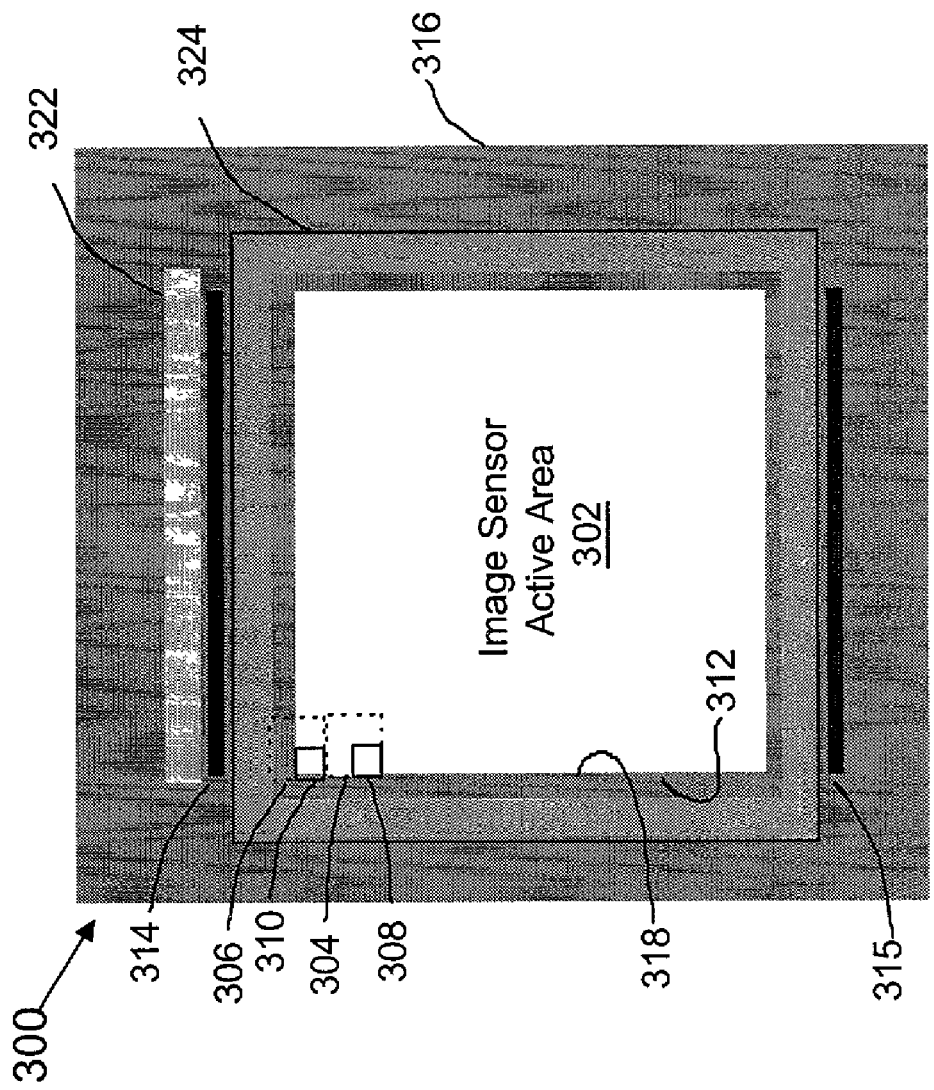
FIG. 3 is a top-level view illustrating a solid-state image sensor having an exemplary guard ring, in accordance with the invention.

In FIG. 3, a solid-state image sensor 300 having a radiation guard ring 324 is shown. The radiation guard ring 324 surrounds the active area 302 of the solid-state image sensor 300. The image sensor 300 also includes a dark signal detector 314 and 315. A portion of the guard ring 306 traverses between cells 302 and 306 of the active area 302, and the dark signal detector 314. As depicted, dark signal detectors 314 and 315 are disposed beneath a shield 316 to prevent direct radiation from affecting the measurement of the dark signal level by the dark signal detectors 314 and 315. In addition, the radiation guard ring 324 prevents the majority of minority carriers from reaching the dark signal detector 314. Each cell 304 and 306 has a respective radiation detector 308 and 310 for receiving a charge and converting the charge to a corresponding electrical signal for an image processor (not shown). The radiation detectors 308 and 310 are located on the periphery of the outer edge 312 of active area 302. The interior edge 318 of the shield 316 extends along an outer edge 312 of the active area 302. The dark signal detector 314 and 315 is disposed beneath the shield 316 and behind the radiation guard ring 324. The shield 316 and radiation guard ring 324 reduce the number of minority carriers moving laterally towards the dark signal detector 314 and 315 from reaching the dark signal detector 314 and 315, enabling an accurate black reference level measurement.

Figure 4:
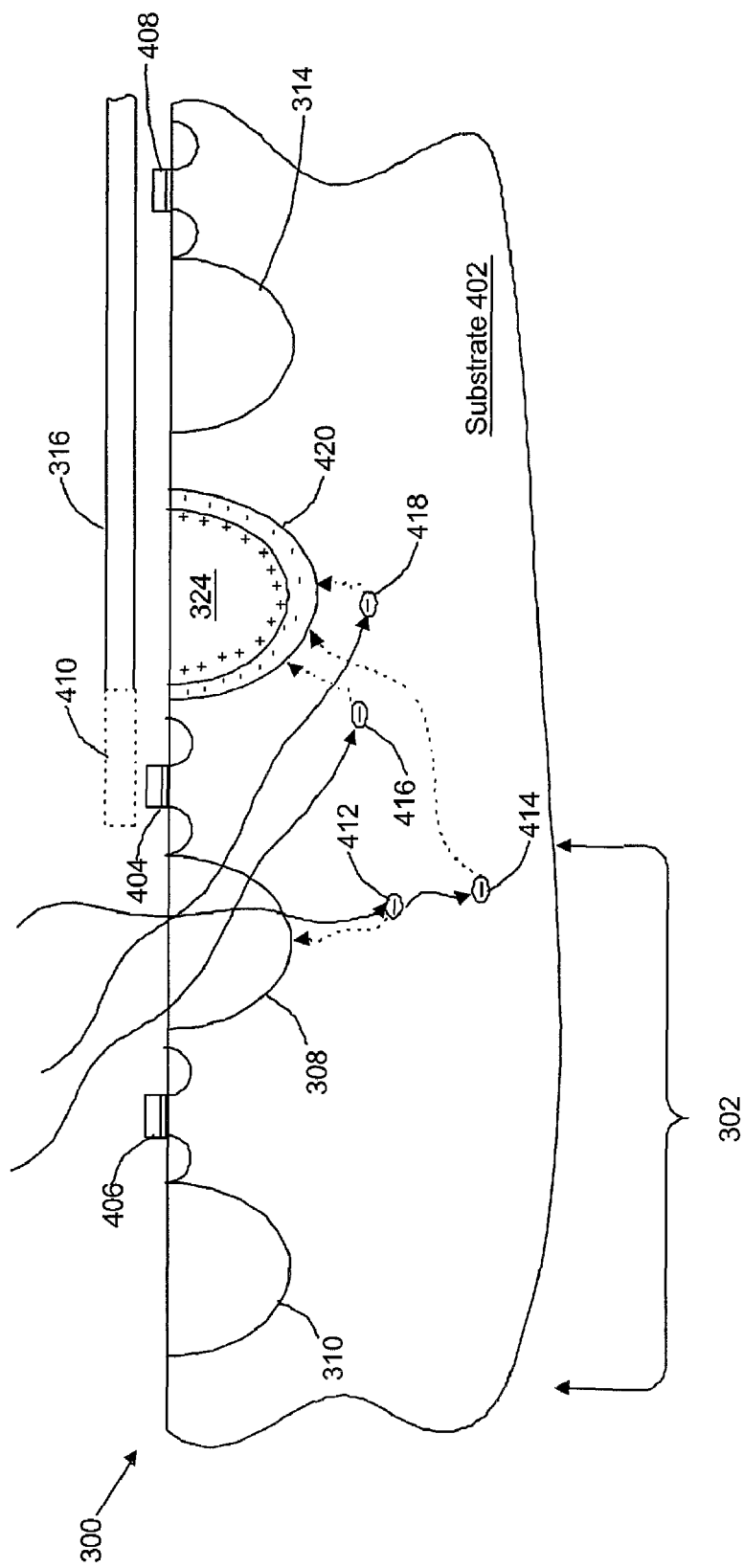
FIG. 4 illustrates a cross sectional view of solid-state imaging sensor of FIG. 3 having the exemplary guard ring.

In FIG. 4, a cross sectional view of the solid-state image sensor 300 of FIG. 3 having the exemplary guard ring 324 is illustrated. A signal detector 310 with column circuit element 406, signal detector 308 with column circuit element 404, dark signal detector 314 with column circuit element 408 and guard ring 324 are formed in substrate 402. The dark signal detector 314 and the radiation guard ring 324 have a first conductivity type (e.g., n-type doping) while the substrate has second conductivity type (e.g., p-type doping). The radiation guard ring 324 preferably has a depth approximately equal to or greater than the depth of the dark signal detector 314. In order to further attract minority carriers traveling near the outer edge 312 of the active area 302, the radiation guard ring 324 preferably has a doping level that is approximately equal to or greater than the doping level of the dark signal detector 314. The radiation guard ring has a preferred depth in the substrate equal to or greater than 1.5 microns. In alternate embodiments, the depth of the radiation guard ring 324 may be as shallow as 0.5 microns.

The radiation guard ring 324 attracts minority carriers 414, 416 and 418 when reversed biased. The attraction of the minority carriers 414, 416 and 418 to the radiation guard ring 324, preventing them from reaching the dark signal detector 314. The separation distance between the active area 302 and the dark signal detector 314 can be substantially reduced to less than 50 microns when a guard ring of about 10 microns width is present. This enables effective measurement of dark reference levels under stringent operational conditions with only a minimal increase in the total die area needed for the image sensor.

Because the dark reference level measured by the radiation detector 308 and the dark signal detector 314 are principally attributable to similar defects occurring in the formation of the detectors in the substrate 402, an accurate measurement of the dark signal by the dark signal detector 314 should occur with the radiation detector 308 and the dark signal detector 314 being substantially similar. Thus, the same defects or artifacts that are present in one detector as a result of fabrication are likely to be present in the other detector such that the dark signal measurement obtained by reading the dark signal detector 314 is sufficiently identical to the dark signal component from the radiation detector 308.

In FIG. 5, an example process 500 is illustrated that is performed by the solid-state image sensor 300 to measure the dark reference level associated with the radiation detectors while suppressing radiation charges from directly or indirectly reaching the dark signal detector. Initially, the radiation detector 308 or a portion of radiation detectors to be read (e.g., a row of radiation detectors) is reset to a known potential (e.g., zero volts) (510). The dark signal detector may be reset at the same time as the radiation detector 308 in the active area 302. A biasing potential is applied (520) to the radiation ring 324 to form a depiction region 420 at a junction between radiation guard ring 324 and the substrate 402. Minority carriers, that would otherwise reach the dark signal detector 314, collect in the depletion region 420 formed with the radiation guard ring 324.

Next, the integration period commences as the portion of radiation detectors to be read is enabled to receive radiation (530). For example, when the dark signal detector 314 is formed in the same row as the radiation detector 308, the detectors 308, 314 can share a common reset and enable. Radiation penetrating into the active area 302 (e.g., radiation that penetrates through the radiation detector 308) form minority carriers is attracted (540) to the radiation guard ring 324 before they reach the dark signal detector 314. Following a predetermined integration period (550) for sensing radiation, the radiation detectors 308 and the dark signal detector 314 may simultaneously be read out (560). This method advantageously permits the dark signal detector to be read at the same temporal condition (e.g., same substrate temperature) as the radiation detector 308 to further facilitate an accurate dark reference level measurement for post processing of an image signal.

While various embodiments of the invention have been described, it will be apparent to those of ordinary skill in the art that many more embodiments and implementations are possible that are within the scope of this invention.

What is claimed is:

1. A method for measuring a dark reference level in an image sensor, comprising:
    shielding an at least one dark signal detector that is located in a substrate;
    detecting a charge on the at least one dark signal detector;
    determining a dark reference level of the charge on the at least one dark signal detector, wherein the shielding further includes activating a guard ring in the substrate that prevents minority carriers from contact with the at least one dark signal detector; and
    simultaneously reading out a radiation detector and the at least one dark signal detector, wherein the at least one dark signal detector is spaced apart from the radiation detector in order to prevent any minority carriers that are not absorbed by the radiation detector from reaching the at least one dark signal detector.

2. An image sensor that measures a radiation charge having a substrate comprising:
    a radiation detector formed with the substrate;
    a dark signal detector formed with the substrate a predetermined distance from the radiation detector; and
    a shield associated with the dark signal detector that prevents a radiation charge from direct contact with the dark signal detector, wherein the substrate between the dark signal detector and the radiation detector is free from a presence of a device separating layer, wherein the shield is a metal shield, wherein the metal shield conducts at least one signal in the image sensor.

3. A method for measuring a dark reference level in an image sensor, comprising:
    shielding an at least one dark signal detector that is located in a substrate, the substrate further including a radiation detector, wherein the substrate between the dark signal detector and the radiation detector is free from a presence of a device separating layer, wherein the shielding further includes covering the at least one dark signal detector with a metal shield, wherein the covering further includes conducting a signal associated with the image sensor through the metal shield;
    detecting a charge on the at least one dark signal detector; and
    determining the dark reference level of the charge on the at least one dark signal detector.

4. An apparatus for measuring a dark reference level in an image sensor, comprising:
    means for shielding an at least one dark signal detector that is located in a substrate, the substrate further including a radiation detector, wherein the substrate between the dark signal detector and the radiation detector is free from a presence of a device separating layer, wherein the means for shielding further includes a means for covering the at least one dark signal detector with a metal shield, wherein the means for covering further includes a means for conducting a signal associated with the image sensor through the metal shield;
    means for detecting a charge on the at least one dark signal detector; and
    a means for determining the dark reference level of the charge on the at least one dark signal detector.

5. An image sensor that measures a radiation charge having a substrate comprising:
   a radiation detector formed with the substrate;
   a dark signal detector formed with the substrate a predetermined distance from the radiation detector;
   a shield associated with the dark signal detector that prevents a minority carrier from direct contact with the dark signal detector; and
   a guard ring in the substrate disposed between the radiation detector and the dark signal detector, wherein the guard ring is disposed beneath the shield.

6. An image sensor that measures a radiation charge having a substrate comprising:
   a radiation detector formed with the substrate;
   a dark signal detector formed with the substrate a predetermined distance from the radiation detector;
   a shield associated with the dark signal detector that prevents a minority carrier from direct contact with the dark signal detector; and
   a guard ring in the substrate disposed between the radiation detector and the dark signal detector, wherein the guard ring has a guard ring, doping level that is at least approximately equal to a dark signal detector doping level of the dark signal detector.

7. An image sensor that measures a radiation charge having a substrate comprising:
   a radiation detector formed with the substrate;
   a dark signal detector formed with the substrate a predetermined distance from the radiation detector;
   a shield associated with the dark signal detector that prevents a minority carrier from direct contact with the dark signal detector; and
   a guard ring in the substrate disposed between the radiation detector and the dark signal detector, wherein the guard ring has a width equal at least 5 microns and the dark signal detector is located at least 40 microns from a closest radiation detector of a plurality of radiation detectors.

8. An image sensor that measures a radiation charge having a substrate comprising:
   a radiation detector formed with the substrate;
   a dark signal detector formed with the substrate a predetermined distance from the radiation detector;
   a shield associated with the dark signal detector that prevents a minority carrier from direct contact with the dark signal detector; and
   a guard ring in the substrate disposed between the radiation detector and the dark signal detector, wherein the guard ring has a width of at least 10 microns and the dark signal detector is located at 40 microns from a closest radiation detector of a plurality of radiation detectors.

9. An image sensor that measures a radiation charge having a substrate comprising:
   a radiation detector formed with the substrate;
   a plurality of dark signal detectors spaced apart from the radiation detector in order to prevent minority carriers that are not absorbed by the radiation detector from reaching the plurality of dark signal detectors, wherein the radiation detector and the plurality of dark signal detectors are adapted to be simultaneously read out;
   a shield associated with the dark signal detector that prevents at least some of the minority carriers from direct contact with the plurality of dark signal detectors; and
   a guard ring in the substrate disposed between the radiation detector and the plurality of dark signal detectors, wherein the guard ring is disposed beneath the shield.

10. An image sensor that measures a radiation charge having a substrate comprising:
    a radiation detector formed with the substrate;
    a plurality of dark signal detectors spaced apart from the radiation detector in order to prevent minority carriers that are not absorbed by the radiation detector from reaching the plurality of dark signal detectors, wherein the radiation detector and the plurality of dark signal detectors are adapted to be simultaneously read out;
    a shield associated with the dark signal detector that prevents at least some of the minority carriers from direct contact with the plurality of dark signal detectors; and
    a guard ring in the substrate disposed between the radiation detector and the plurality of dark signal detectors, wherein the guard ring has a guard ring doping level that is at least approximately equal to a dark signal detector doping level of the plurality of dark signal detectors.

11. The image sensor according to claim 10, wherein the guard ring and the plurality of dark signal detectors each have an n-type doping.

12. The image sensor according to claim 10, wherein the substrate has a p-type doping.

* * * * *

UNITED STATES PATENT AND TRADEMARK OFFICE
CERTIFICATE OF CORRECTION

| | | |
|---|---|---|
| PATENT NO. | : 7,053,458 B2 | Page 1 of 1 |
| APPLICATION NO. | : 10/136413 | |
| DATED | : May 30, 2006 | |
| INVENTOR(S) | : Mann et al. | |

It is certified that error appears in the above-identified patent and that said Letters Patent is hereby corrected as shown below:

In the claims, column 7, line 22, reading "guard ring has a guard ring, doping level that is" should read -- guard ring has a guard ring doping level that is --.

Signed and Sealed this

Fifth Day of September, 2006

JON W. DUDAS
*Director of the United States Patent and Trademark Office*